US006178089B1

(12) United States Patent
Alfonso et al.

(10) Patent No.: US 6,178,089 B1
(45) Date of Patent: Jan. 23, 2001

(54) SECURING DEVICE FOR COMPUTER EQUIPMENT HOUSING

(75) Inventors: Pedro M. Alfonso, Austin, TX (US); Brian M. Byle, Canfield, OH (US)

(73) Assignee: Dell U.S.A., L.P., Austin, TX (US)

( * ) Notice: Under 35 U.S.C. 154(b), the term of this patent shall be extended for 0 days.

(21) Appl. No.: 09/116,040

(22) Filed: Jul. 15, 1998

(51) Int. Cl.[7] .............................. H05K 7/16; E05B 73/00
(52) U.S. Cl. .............................................. 361/727; 70/58
(58) Field of Search ..................................... 361/724, 726; 70/58, 59

(56) References Cited

U.S. PATENT DOCUMENTS

| | | | | |
|---|---|---|---|---|
| 4,252,007 | | 2/1981 | Kerley | 70/58 |
| 4,453,692 | | 6/1984 | LeDoux et al. | 248/552 |
| 4,585,202 | | 4/1986 | Parsekian | 248/553 |
| 4,613,109 | | 9/1986 | Boscacci | 248/553 |
| 4,656,848 | | 4/1987 | Rose | 70/58 |
| 4,729,614 | | 3/1988 | Nadler et al. | 312/292 |
| 4,733,840 | | 3/1988 | D'Amore | 248/205 |
| 4,946,127 | | 8/1990 | Kulaga | 248/551 |
| 5,154,456 | | 10/1992 | Moore et al. | 292/162 |
| 5,228,319 | | 7/1993 | Holley et al. | 70/58 |
| 5,288,049 | * | 2/1994 | Hays . | |
| 5,361,610 | | 11/1994 | Sanders | 70/14 |
| 5,381,685 | | 1/1995 | Carl et al. | 70/78 |
| 5,398,530 | | 3/1995 | Derman | 70/58 |
| 5,493,878 | | 2/1996 | Murray, Jr. et al. | 70/58 |
| 5,502,989 | | 4/1996 | Murray, Jr. et al. | 70/58 |
| 5,519,572 | | 5/1996 | Luo et al. | 361/685 |
| 5,604,663 | | 2/1997 | Shin et al. | 361/686 |
| 5,631,449 | | 5/1997 | Wang | 181/141 |
| 5,668,882 | | 9/1997 | Hickman et al. | 381/24 |
| 5,682,290 | | 10/1997 | Markow et al. | 361/683 |
| 5,697,233 | * | 12/1997 | Albert et al. . | |
| 5,701,347 | | 12/1997 | Daniels et al. | 381/24 |
| 5,987,937 | * | 11/1999 | Lee | 361/686 X |

* cited by examiner

*Primary Examiner*—Jeffrey Donels
(74) *Attorney, Agent, or Firm*—Skjerven, Morrill, MacPherson, LLP; David G. Dolezal

(57) ABSTRACT

A securing device for securing a computer equipment housing. The securing device is pivotable and slideable with respect to the computer equipment housing. The securing device is physically coupled to the computer equipment housing by e.g. via a pin and slot configuration. A securing device is e.g. a flat metal bar having a dog leg at one end with an elongated opening for receiving a securing implement such as a padlock shackle. The other end of one type of securing device has a pin structure that is secured in a slot of the computer equipment housing to physically secure the securing device to the computer system housing. The securing device can be used to secure computer equipment (such as speakers) to a main computer system housing.

41 Claims, 9 Drawing Sheets

SECURING DEVICE FOR COMPUTER EQUIPMENT HOUSING

BACKGROUND OF THE INVENTION

1. Field of the Invention

This invention relates in general to computer systems and more specifically to a securing device for computer equipment.

2. Description of the Related Art

Computer systems exist in many forms including, for example, mainframes, minicomputers, workstations, servers, personal computers, internet terminals, notebooks, and embedded systems. Personal computer (PC) systems, such as the International Business Machines (IBM) compatible PC systems, include desk top, floor standing, or portable versions. A typical computer system includes a system processor, associated memory and control logic, and a number of peripheral devices, such as display monitors, keyboards, mouse-type input devices, floppy and hard disk drives, CD-ROM drives, audio speakers, and printers. A computer system may also include other peripheral devices such as network capability, terminal devices, modems, televisions, sound devices, voice recognition devices, electronic pen devices, and mass storage devices such as tape drives, CD-R drives, or DVDs.

The components of a computer system are housed in at least one computer equipment housing. However, a computer system may include a number of computer equipment housings such as with a desktop computer system that includes at least a main system housing, a separate housing for the monitor, and a housing for the keyboard.

Theft of computer equipment is a problem especially for computer systems used in public environments such as in a school or library. To prevent theft, computer system equipment housings have included securing devices which enable the computer equipment housings to be secured to other structures. One problem with these securing devices is that they generally lack a wide degree of freedom with respect to the computer equipment housing which may make it difficult to align the securing devices of multiple computer system housings. Another problem with these securing devices is that they may add to the bulk of a computer equipment housing by extending out from the computer system housing when not in use. Also, these securing devices can detract from the aesthetics of a computer equipment housing especially if the securing device is not being used.

SUMMARY OF THE INVENTION

It has been discovered that providing a securing device for a computer system housing that is slideable and pivotable with respect to the computer equipment housing provides a securing device with an engaging structure having a wide degree of freedom with respect to the housing structure and yet provides the securing device with the ability to be moved to a position where the securing device resides within the computer equipment housing when not in use.

In one aspect of the present invention, a computer system has a system processor and includes a housing which houses a peripheral device. The peripheral device is operably coupled to the system processor. The computer system further includes a securing device physically coupled to the housing. The securing device is slideable and pivotable with respect to the housing.

In another aspect of the present invention, a securing device for securing computer system equipment includes means for slideably and pivotably coupling the securing device to a housing and means for engaging a structure for securing the securing device to secure the housing. The means for engaging is physically coupled to the means for slideably and pivotably coupling.

In another aspect of the present invention, an apparatus for securing computer equipment includes a computer equipment housing and a securing device physically coupled to the housing. The securing device is slideable and pivotable with respect to the housing.

In another aspect, the present invention includes a securing device for securing computer equipment. The securing device includes a securing member having a first portion and a second portion. The first portion has a structure which engages a securing implement. The securing device also includes an attachment mechanism connected to the second portion. The attachment mechanism physically couples the securing member to a computer equipment housing. The securing member is pivotable and slideable with respect to the housing.

BRIEF DESCRIPTION OF THE DRAWINGS

The present invention may be better understood, and its numerous features and advantages made apparent to those skilled in the art by referencing the accompanying drawings.

DETAILED DESCRIPTION

The following sets forth a detailed description of one mode for carrying out the invention. The description is intended to be illustrative of the invention and should not be taken to be limiting.

Figure 1:
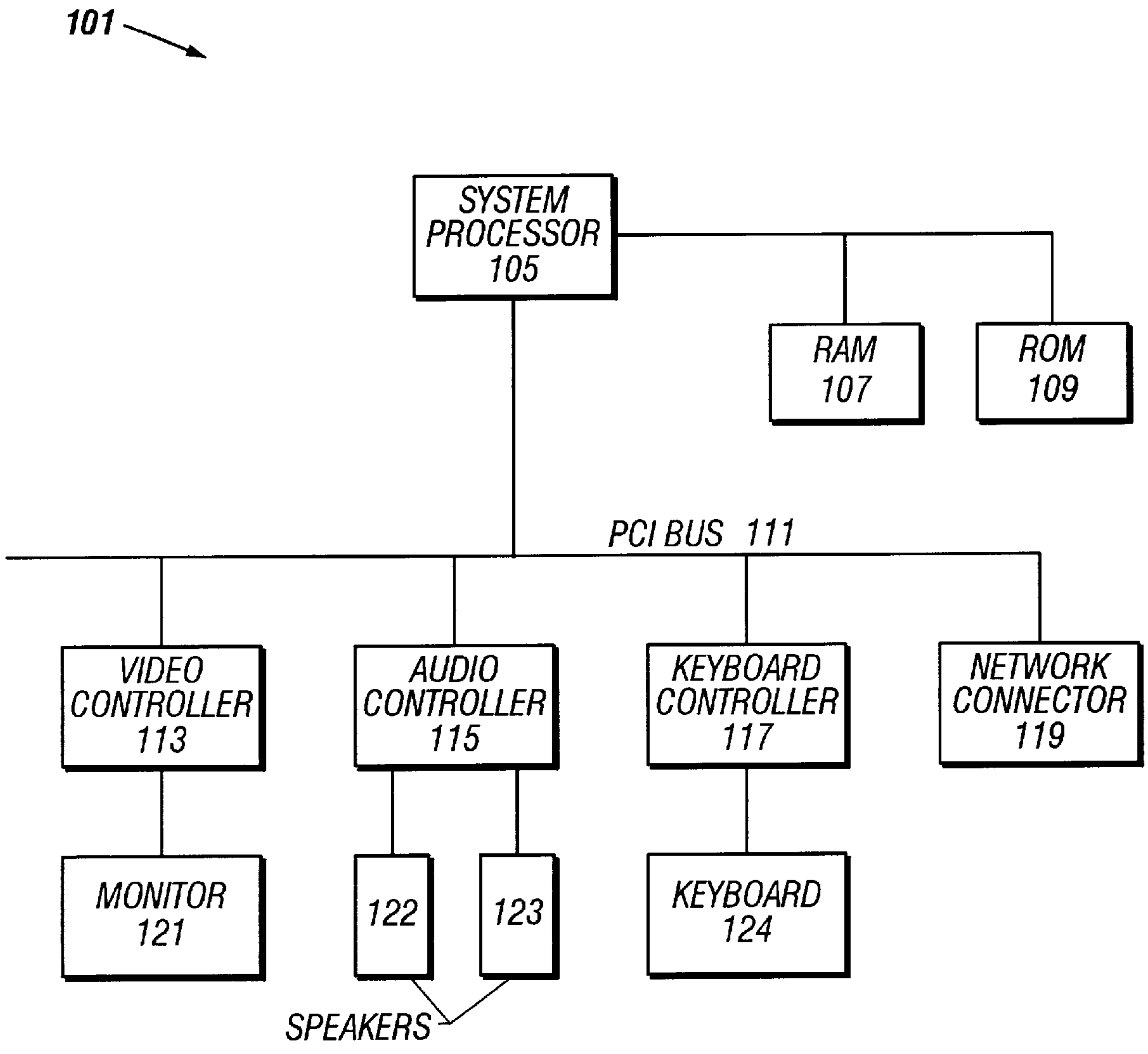
FIG. 1 shows a block diagram of one embodiment of a computer system according to the present invention.

FIG. 1 shows a block diagram of one embodiment of a computer system according to the present invention. In the embodiment shown, Computer system 101 is a personal computer system including a system processor 105, which conforms e.g. to the X86 architecture such as the PENTIUM II processor by INTEL CORPORATION. RAM 107 and ROM 109 are operably coupled to the system processor 105. Computer system 101 also includes a video controller 113, audio controller 115, keyboard controller 117, and network connector 119, which are all operably coupled to the system processor 105 via a computer system bus such as a PCI bus 111. A computer monitor 121 is operably coupled to the video controller 113. Speakers 122 and 123 are operably coupled to the audio controller 115. Computer system 101 also includes a keyboard 124 which is operably coupled to the keyboard controller 117. One example of such a computer system is the OPTIPLEX-GXI sold by the DELL COMPUTER CORPORATION.

Figure 2:
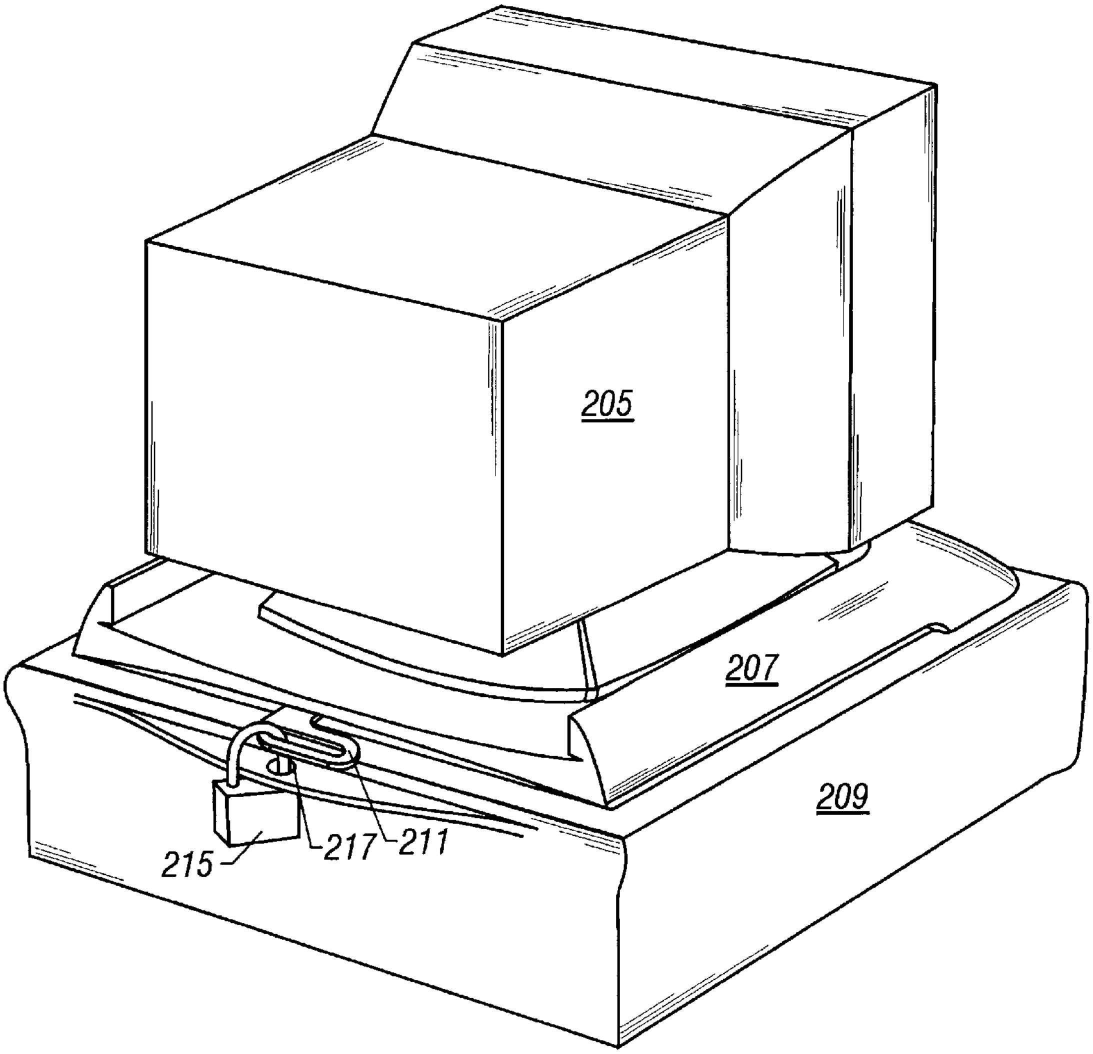
FIG. 2 is a perspective view of one embodiment of a computer system with a securing device according to the present invention.
Figure 3:
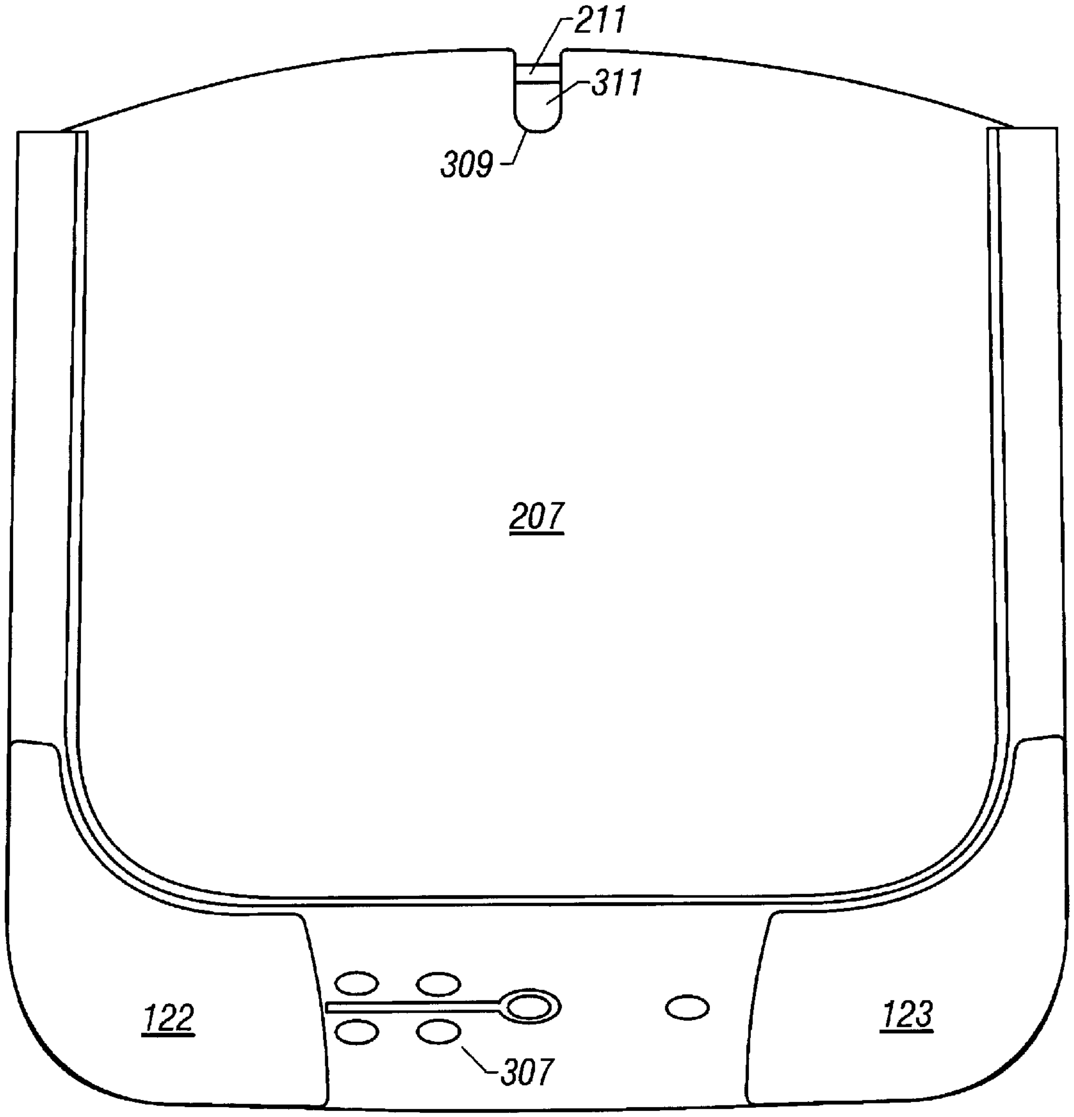
FIG. 3 is a top view of one embodiment of a computer equipment housing with a securing device in a retracted position.

FIG. 2 is a perspective view of one embodiment of a computer system with a securing device according to the present invention. The computer system shown in FIG. 2 includes a monitor housing 205, an audio hub housing 207, and a main system housing 209. The main system housing 209 houses the system processor 105, RAM 107, ROM 109, video controller 113, audio controller 115, keyboard controller 117, PCI bus 111, and network connector 119. The monitor housing 205 houses the monitor 121, and the audio hub housing 207 houses speakers 122 and 123. Physically coupled to the audio hub housing 207 is a securing device 211 in accordance with the invention. Securing device 211 is used to secure the audio hub housing 207 to the main system housing 209. The shackle of padlock 215 extends through a corresponding opening in the securing device 211 and through an opening 217 of the main system housing 209 extending from an outer wall of the housing. In the view shown in FIG. 1, the audio hub housing 207 is physically secured to the main system housing 209 by the securing device 211 and padlock 215. In one embodiment, the main system housing 209 includes a hasp having an opening for receiving the padlock shackle or other securing implement FIG. 3 is a top view of one embodiment of a computer equipment housing according to the present invention. The housing shown in FIG. 3 is an audio hub housing 207 that houses speakers 122 and 123 and speaker controls 307 such as volume and tone knobs. The audio hub housing shown in FIG. 3 is designed to be placed on top of a main system housing with a monitor placed on top of the audio hub housing (as shown in FIG. 2). In such a position, the speakers 122 and 123 are firmly positioned with respect with the main system housing 209 and monitor housing 205. Consequently, securing the audio hub housing with the securing device advantageously secures the computer speakers to the main system housing and therefore inhibits the theft of the speakers.

In FIG. 3, the securing device 211 is in its retracted position with respect to the audio hub housing 207. In this retracted position, the securing device resides within the audio hub housing 207 and thus is largely hidden from view in FIG. 3. Audio hub housing 207 includes a notch 309 in a top panel that allows a securing implement such as padlock shackle to extend through the opening 311 in the securing device 211 when the securing device is a fully retracted position.

Figure 4:
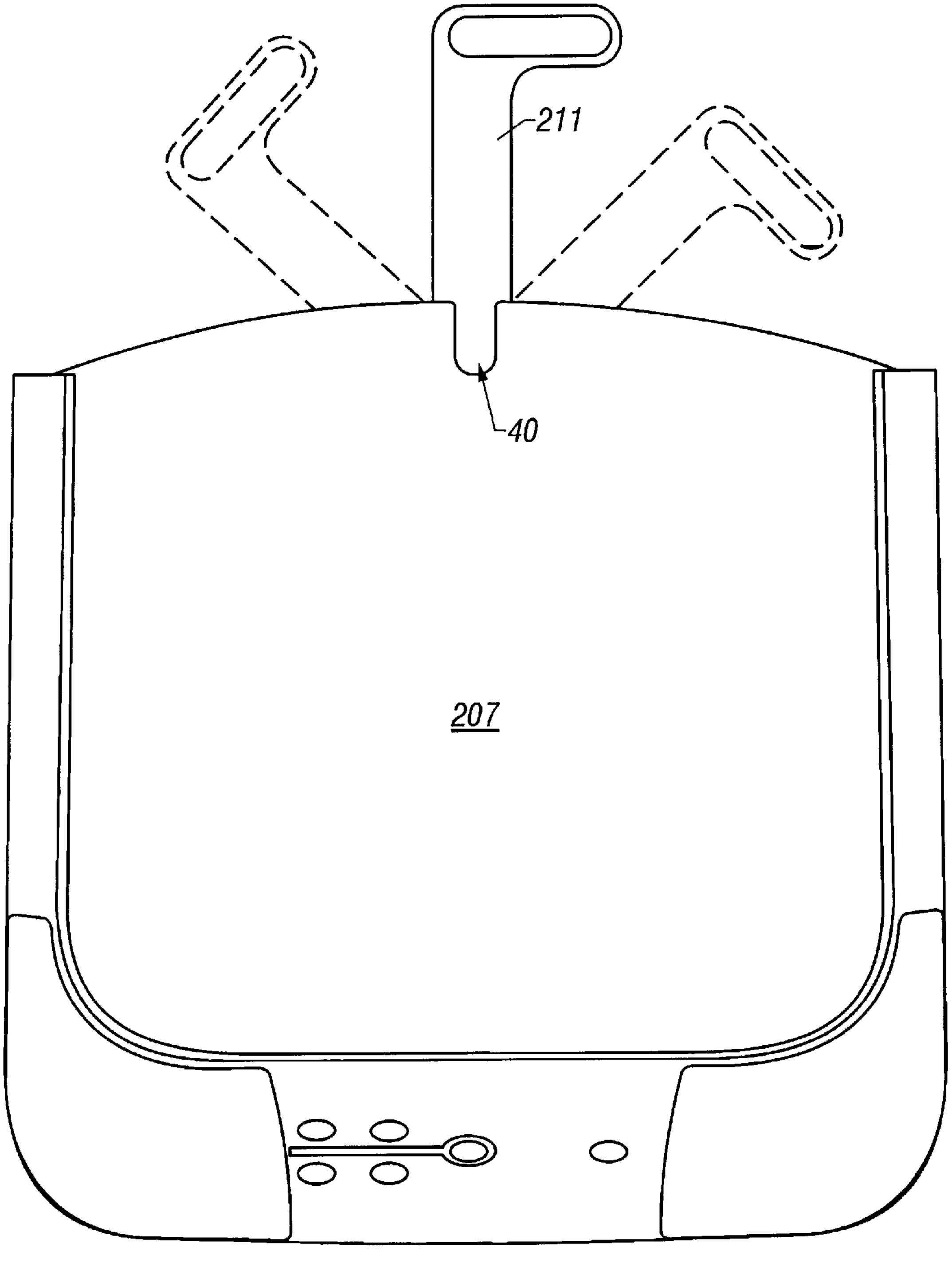
FIG. 4 is a top view of one embodiment of a computer equipment housing with a securing device in an extended position.

FIG. 4 shows a top view of the audio hub housing 207 with the securing device 211 in its extended position. When in the extended position shown in FIG. 4, securing device 211 is pivotable with respect to the audio hub housing 207 with two alternate positions of the securing device 211 are shown in phantom.

Figure 5:
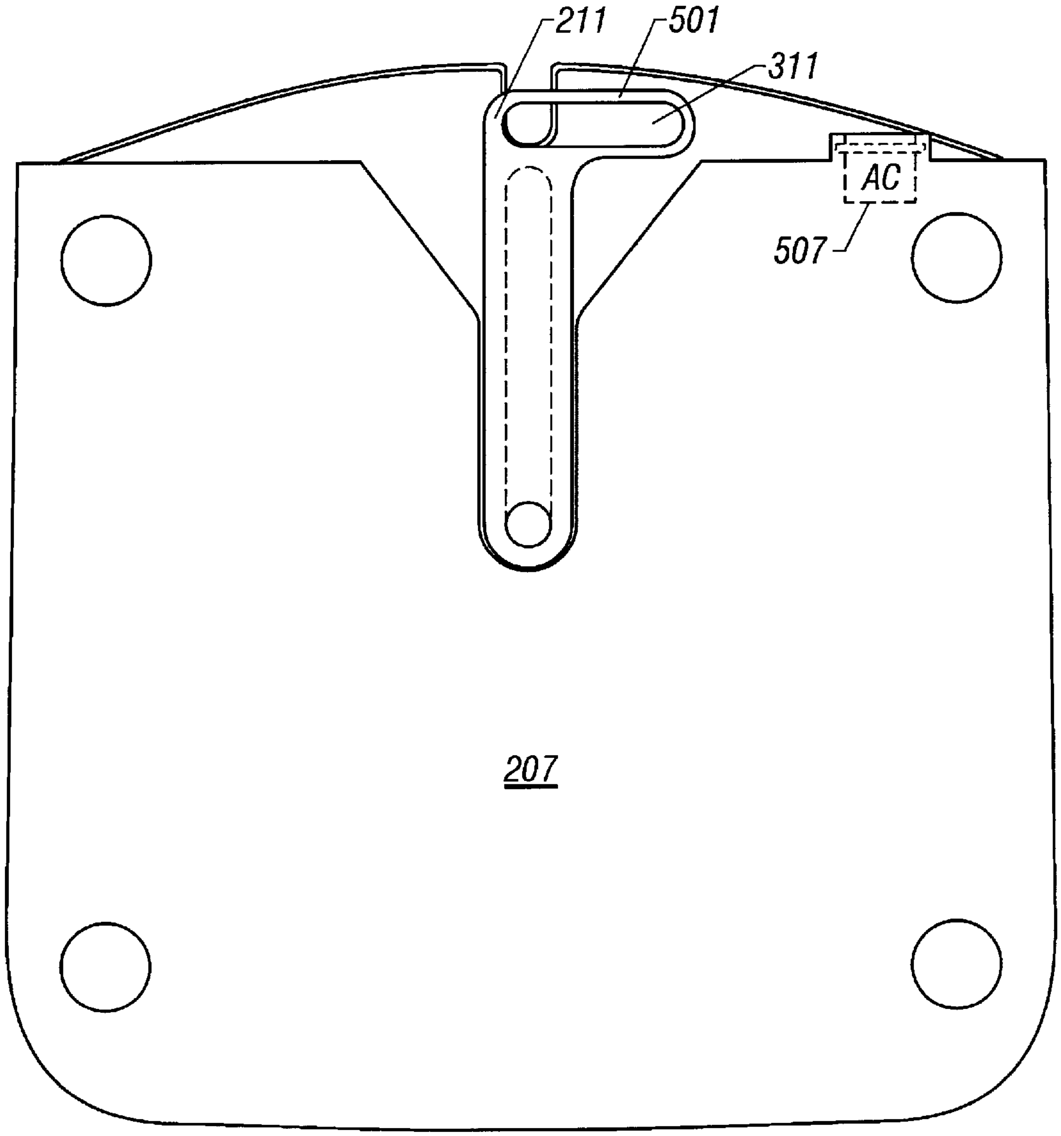
FIG. 5 is a bottom view of one embodiment of a computer equipment housing with a securing device in a retracted position.

FIG. 5 is a bottom view of the audio hub housing 207 showing the securing device 211 in its retracted position with respect to the audio hub housing 207. Securing device 211 includes a dog leg 501 having an elongated opening 311 for receiving a securing implement such as a padlock shackle to secure the audio hub to another structure. The elongation of the opening provides further flexibility in aligning the opening 311 with a corresponding opening of the main system housing such that a padlock shackle can extend through both the main system housing opening and the securing device opening 311. In one embodiment, opening 311 is wide enough to receive at least the shackle of a number 3 padlock. Also shown in FIG. 5 is a conventional AC receptacle 507 for providing AC power to the speakers and associated circuitry of the audio hub.

Figure 6:
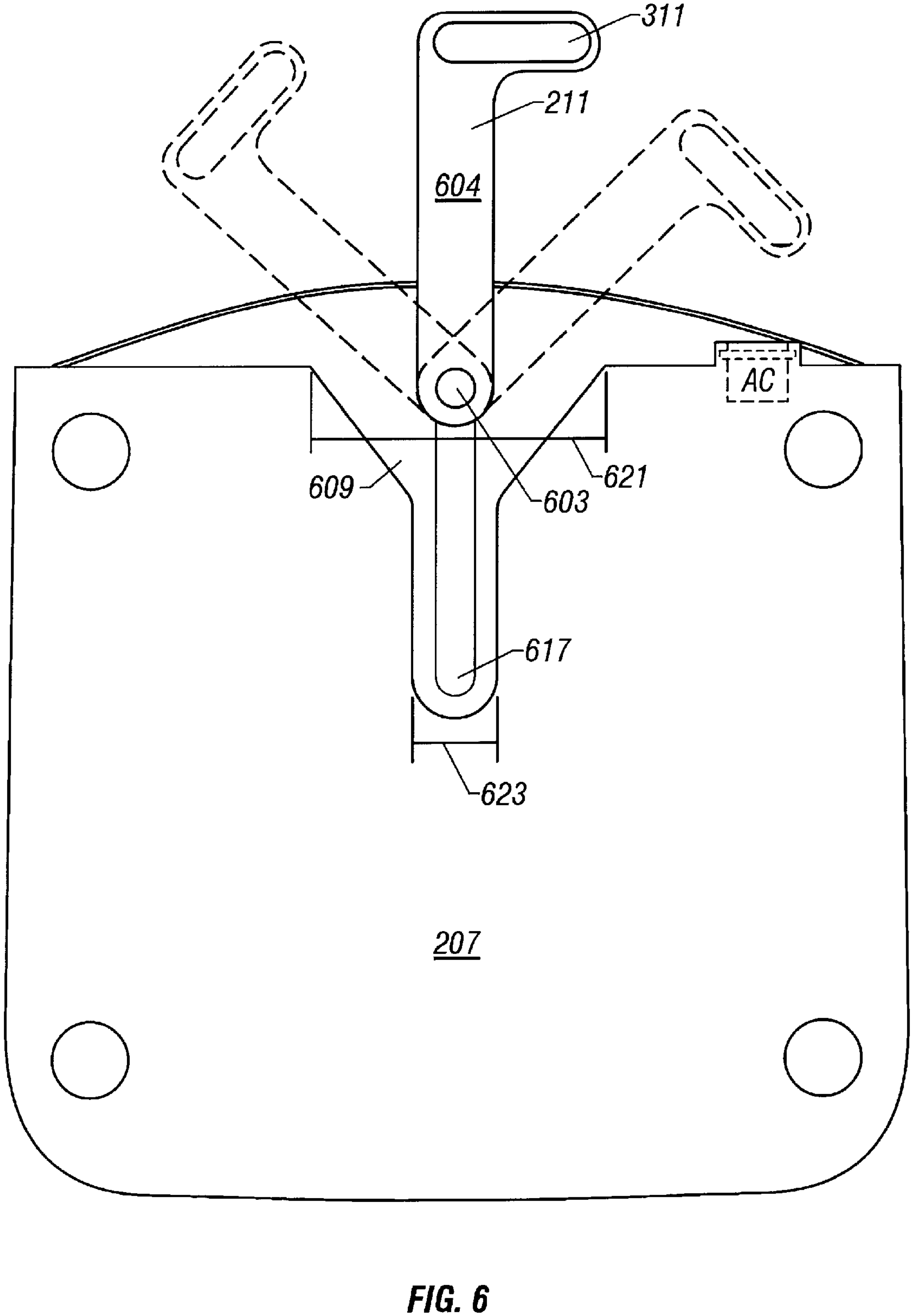
FIG. 6 is a bottom view of one embodiment of a computer equipment housing with a securing device in an extended position.

FIG. 6 shows a bottom view of the audio hub housing 207 with the securing device 211 is in a fully extended position. In this fully extended position, securing device 211 is pivotable with respect to the audio hub housing 207. The securing device 211 is physically secured to the audio hub via a pin and slot configuration. Securing device 211 includes a pin structure 603 connected to one end of a securing member 604 of the securing device 211. Pin structure 603 slides within slot 617 of the audio hub housing 207 to allow the securing device 211 to be slideable with respect to the audio hub housing 207 from its retracted position shown in FIG. 5 to its fully extended position as shown in FIG. 6. The ability to slide securing device 211 with respect to the audio hub housing 207 enables the securing device opening 311 to be movable with respect to the audio hub housing 207. Also, the ability to slide the securing device 211 enables the securing device to reside within the securing device compartment 609 of audio hub housing 207 when the securing device 211 is not in use.

The width 621 of the securing device compartment 609 at its opening is wider than the width of the interior portion of the securing device compartment 609. The “widening out” of the securing device compartment 609 provides the securing device 211 room to pivot on pin structure 603 within slot 617 when the securing device is in an extended position. Two alternative positions of the securing device 211 are shown in FIG. 6 in phantom. The ability to pivot securing device 211 with respect to audio hub housing 207 enables opening 311 to be positioned in a variety of locations with respect to the main system housing 207.

The width 623 of the inner portion of compartment 609 is slightly wider than the width of the securing member 604 such that securing member 604 can reside within compartment 609 in its retracted position (see FIG. 5). Having the width 623 of the inner portion of compartment 609 be only slightly wider than the securing member 604 makes the securing device non-pivotal with respect to the audio hub housing 207 when the securing device 211 resides within compartment 609. This advantageously prevents securing device 211 from moving with respect to the audio housing when the securing device 211 is not in use.

Having a securing device that is pivotable and slideable with respect to the associated computer equipment housing enables the opening 311 of the securing device to be positionable with corresponding opening or other structures of the main system housing. Thus, the computer equipment housing can be secured to a number of computer system types regardless of where the corresponding opening in the main computer system housing is positioned. For example, different main system housing types have an opening (such as opening 217) located in different positions depending upon the computer system type. Consequently, providing a securing device that is pivotable and slideable with respect to the computer system housing enables the computer equipment (such as speakers, monitors, keyboards, auxiliary drives, etc.) to be securable to number of main system housing types.

Figure 7:
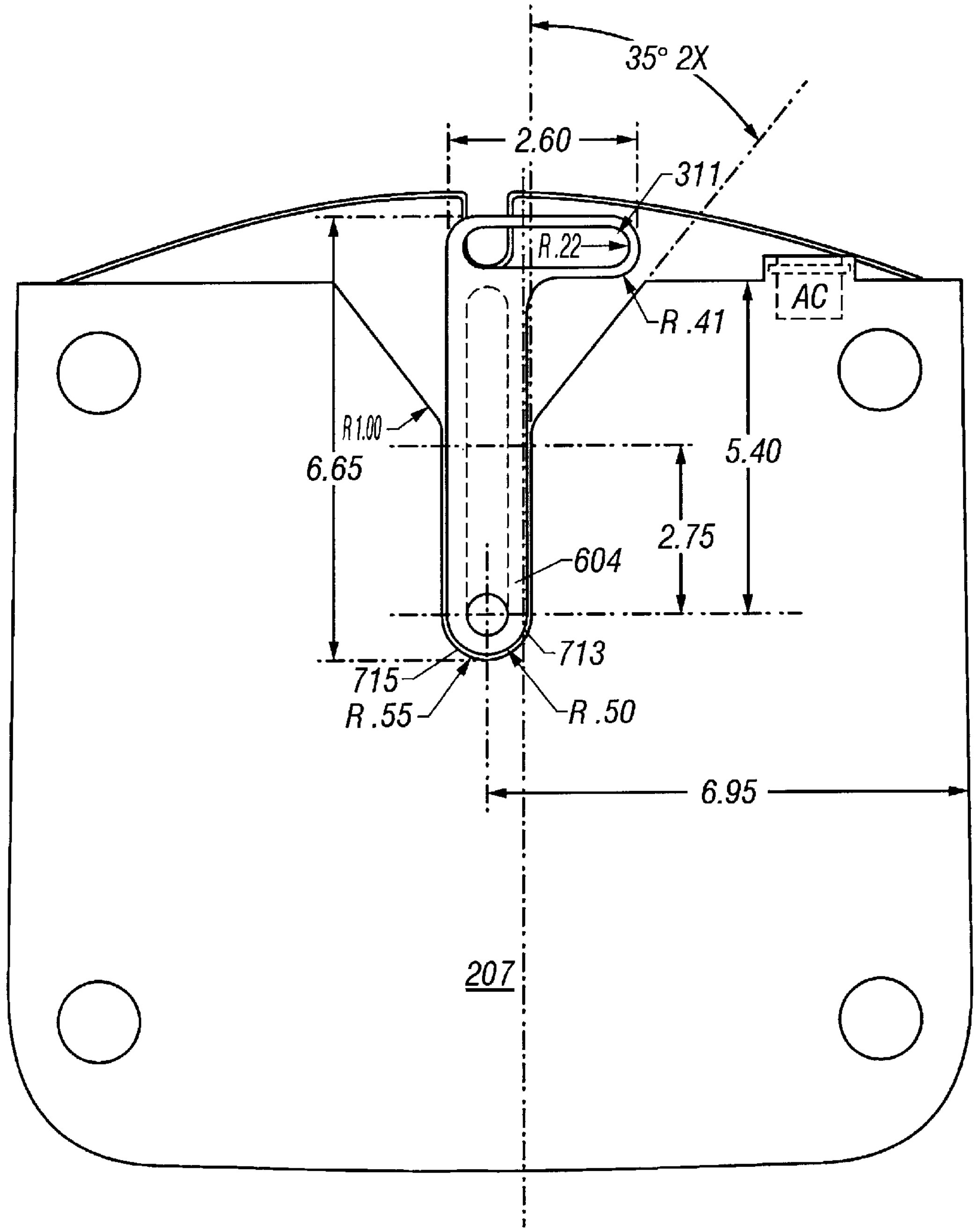
FIG. 7 is a bottom view of one embodiment of a computer equipment housing with a securing device in a retracted position.

FIG. 7 is a bottom view that illustrates the dimensions (in inches) of audio hub housing 207, securing device 211, and securing device component 609. The radius of the end portion 713 of securing member 604 is 0.5 inches and the radius of the interior portion 715 of compartment 609 is 0.55 inches. Also, in FIG. 7, the opening of compartment 609 widens out on one side at a 35.2° angle with respect to the interior portion of the device compartment 609. The dimensions shown in FIG. 7 may vary in other embodiments.

In FIGS. 5, 6, and 7 the securing device compartment 609 is open from the bottom side of the audio hub housing 207. In other embodiments, the securing device compartment is enclosed from the bottom side.

Figure 8:
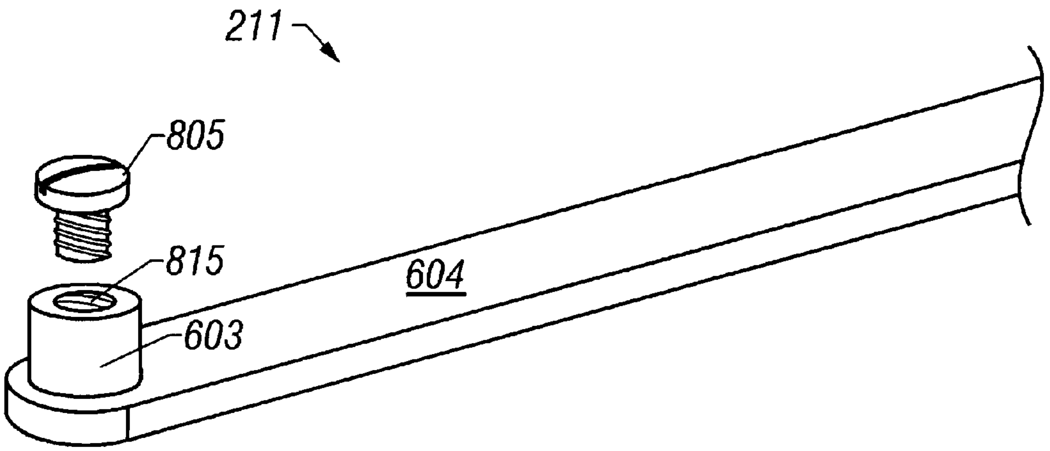
FIG. 8 is a partial perspective view of one embodiment of a securing device according to the present invention.

FIG. 8 shows a partial perspective view of securing device 211. In the embodiment shown, securing device 211 includes a securing member 604 which is a flat, ridged bar like structure having a dog leg at one end (not shown in FIG. 8). In one embodiment, securing member 604 is made of hardened steel. Firmly connected to the other end of securing member 604 is pin structure 603 which, in one in embodiment, is also made of metal. In one embodiment, pin structure 603 is welded to securing member 604. In other embodiments, pin structure 603 is riveted or glued to securing member 604. In another embodiment, pin structure 603 is integrally formed with retaining member 604. In still another embodiment, pin structure 603 is pressed into securing member 604. In this embodiment, pin structure 603 includes an upper cylindrical portion having a larger diameter and a lower cylindrical portion having a smaller diameter. To secure pin structure 603 into the securing member 604, the lower portion is inserted from the top, relative to the view shown in FIG. 8, into a corresponding hole in the securing member 604, wherein a part of the lower portion extends out from the bottom side of the securing member 604. The securing device is then pressed or squeezed such that the part of the lower portion extending from the bottom side of securing member 604 flares out to secure pin structure 603 in the corresponding hole of retaining member 604.

A fastener 805 is used to physically couple the securing device to the audio hub housing 207. In the embodiment shown, fastener 805 is a threaded screw with a widened head. To physically couple securing device 211 to a computer equipment housing, the securing member 604 is placed in compartment 609 with the pin structure 603 placed within the slot 617 (such as in the positions of FIGS. 5 or 6). The threaded portion of screw 805 is screwed into threaded hole 815 from inside of the audio hub housing 207. When the securing device 211 is physical secured to the audio hub housing 207, screw 805 can only be loosened from the inside of the audio hub housing 207. Having fastener 805 accessible only from the interior of the housing inhibits the decoupling of securing device 211 from a computer equipment housing. To remove securing device 211 from audio hub housing 207, one would have to open up the computer system housing to unscrew screw 805 from the pin structure 603. In one embodiment, the audio hub is a "non serviceable" piece of hardware. After the outer covering of the audio hub housing is snapped in placed during manufacture, the audio hub housing has to be broken to gain access to its interior.

In order to physically secure the pin structure 603 within slot 617, the head portion of screw 805 is wider that the width of slot 617. In other embodiments, washers may be located between the head of screw 805 and the pin structure 603 to aid in securing the pin structure in slot 617. In other embodiments, other types of fasteners such as rivets or bolts, may be used to secure pin structure 603 in slot 617.

Figure 9:
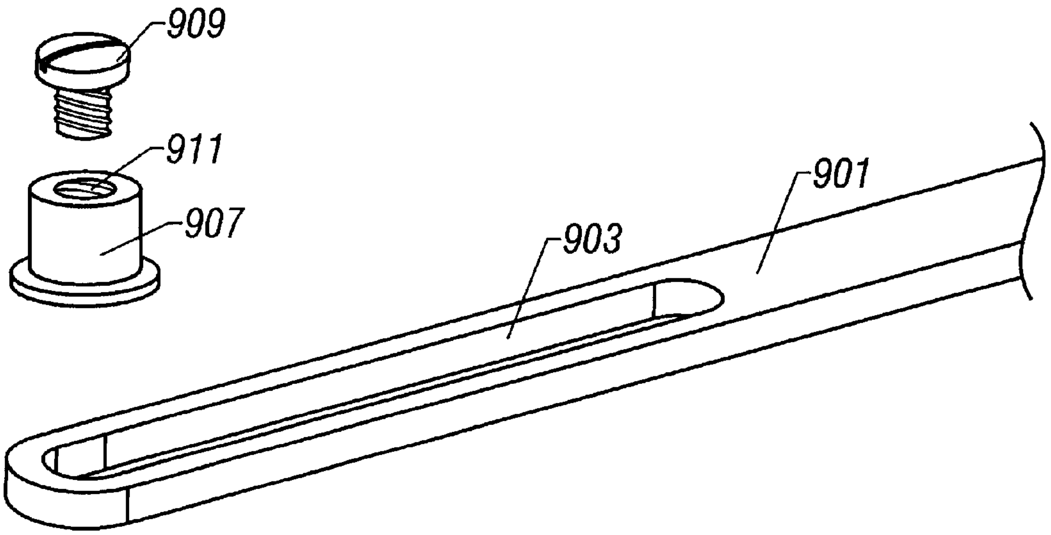
FIG. 9 is a partial perspective view of one embodiment of a securing device according to the present invention.

FIG. 9 shows a partial perspective view of another embodiment of a securing device that is pivotable and slideable with respect to a computer equipment housing. In FIG. 9, a pin structure 907 is fixably secured or attached to the computer equipment housing (not shown). When the securing member 901 is physical coupled to the computer equipment housing, the pin structure 907 is secured within slot 903 of securing member 901. Thus, securing member is pivotable and slideable with respect to pin structure 907. To secure securing member 901 to a computer equipment housing, pin structure 907 is placed through slot 903 from the bottom of securing member 901 (relative to the view shown in FIG. 9). Threaded hole 911 of pin structure 907 is then aligned with a hole in a housing wall of the securing device compartment (not shown in FIG. 9). Screw 909 then is placed from the inside of the housing, through the hole in the housing wall, into hole 911 where it is then screwed into hole 911.

Based upon the teachings described herein, those skilled in the art will appreciate that a securing device that is slideable and pivotable with respect to a computer equipment housing may have other shapes and/or forms and the manner in which it is physically coupled to the computer equipment housing may vary as well. For example, the pin structure may have other forms. With one embodiment, the pin structure may have an elongated form with the elongation running in the same direction as the elongation of the slot. In this embodiment, the elongated pin structure would slide within the computer equipment slot (similar to slot 617). The securing member would be pivotably connected to the elongated slot to enable the securing device to be pivotable with respect to the computer equipment housing. In another embodiment, the pin structure or securing member may have rails that allow it to slide on corresponding rails of the computer equipment housing slot or of the securing device compartment Also in other embodiment, the computer equipment housing slot may have a "non straight" elongated form. In other embodiments, the securing device may be slideable on rollers coupled to the computer equipment housing.

Figure 10:
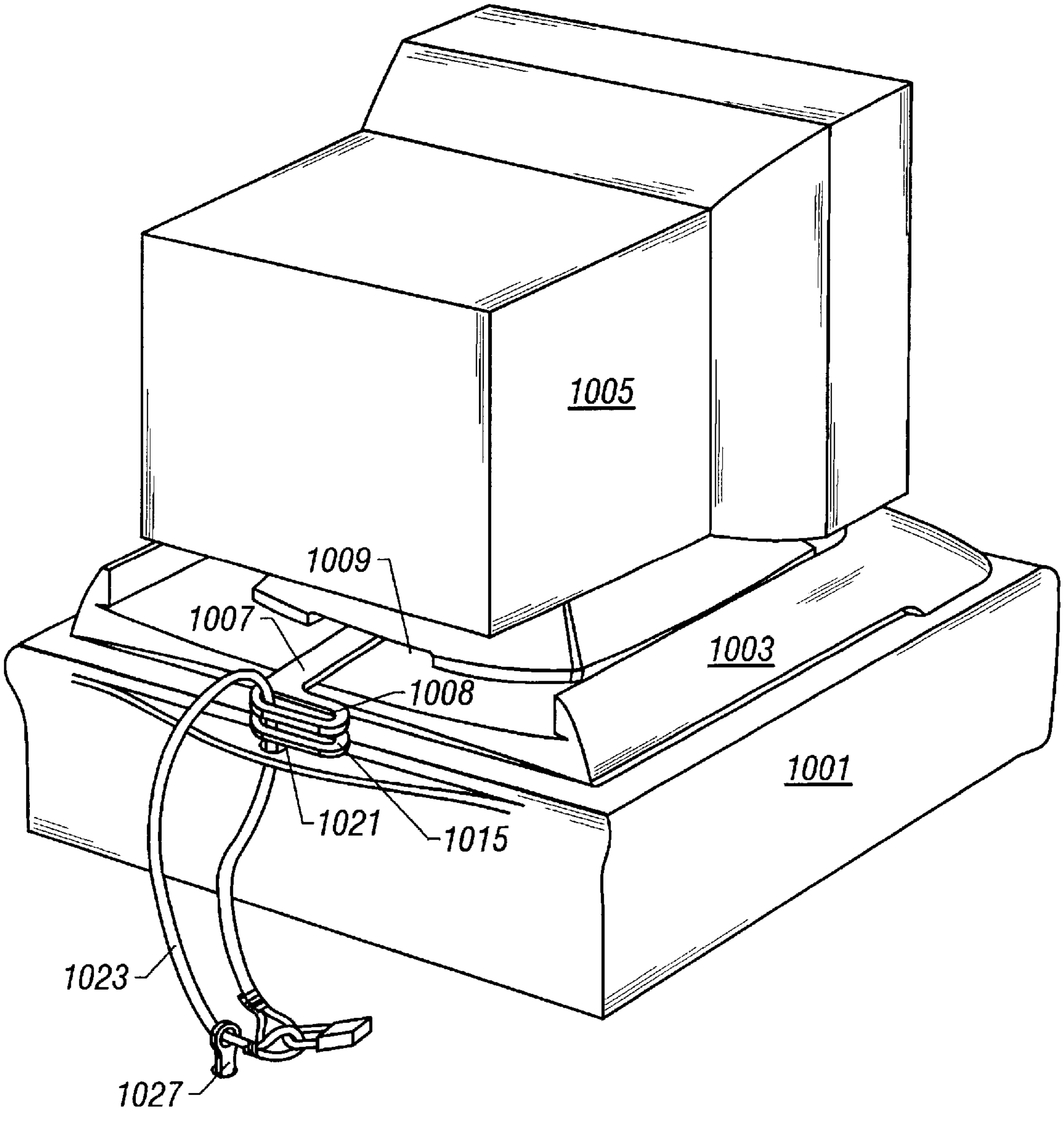
FIG. 10 is a perspective view of one embodiment of a computer system according to the present invention The use of the same reference symbols in different drawings indicates similar or identical items.

Referring to FIG. 10, other types of computer equipment housings may be secured with a securing device that, as disclosed herein, is pivotable and slideable with respect to the computer equipment housing. In FIG. 10, a securing device 1007 is physically secured to the monitor housing 1005 and extends out of an opening 1009 in the bottom backside of the monitor housing 1005. Being pivotable and slideable with respect to the monitor housing 1005 allows the elongated opening 1008 of securing device 1007 to be aligned with the an opening in the securing device 1015 that is physically secured to audio hub housing 1003 and to be aligned with opening 1021 of the main system housing 1001, all to allow a securing implement such as a security cable 1023 to extend through the three openings to secured the monitor housing 1005, audio hub housing 1003, and main system housing 1001 together. The monitor housing 1005, audio hub housing 1003, and main system housing 1001 are also secured to the table via the security cable 1023 extending through an "eye" bolt 1027 fixably secured to the table. Such an arrangement inhibits the unauthorized removal of the entire computer system from its location as shown in FIG. 10. One example of a security cable is a cable with braided metallic strands.

Providing computer equipment housings with securing devices that are pivotable and slideable with respect to the computer equipment housings enables a main computer system housing to be physically securable to multiple computer peripheral devices housed in separate computer equipment housings. In addition, other types of computer equipment housings may be secured with such securing devices. For example, the housings for surge protectors or uninterruptable power supplies may include a securing device similar to securing device 211 for securing those items to a main system housing.

Computer equipment housings having securing devices that are slideable and pivotable with respect to housings allow the computer equipment housings to be secured together even though the housings are not physically compatible. For example, even though in FIG. 10 the backsides of the monitor housing 1005, audio hub 1003, and main system housing 1001 are not flush with one another, providing securing devices that are slideable and pivotable with respect to these housings enables the housings to be easily securable to one another with a securing implement such as a rod or padlock. In other embodiments other types of securing implements may be used such as chains or security cables.

In other embodiments, the main system housing would also include a securing device that is pivotable and slideable with respect to the main system housing. Also, such a securing device that is physically coupled to a portable computer housing may be used to secure the portable computer to a docking station or to a secured structure e.g. wall or table.

While particular embodiments of the present invention have been shown and described, it will be obvious to those skilled in the art that changes and modifications may be made without departing from this invention and its broader aspects and, therefore, the appended claims are to encompass within their scope all such changes and modifications as are within the true spirit and scope of this invention.

What is claimed is:

1. A computer system having a system processor and comprising:

a housing which houses a peripheral device, the peripheral device being operably coupled to the system processor; and a securing device physically coupled to the housing, the securing device being slideable and pivotable with respect to the housing;

wherein the securing device includes a rigid member having a first end and a second end;

wherein the rigid member is slideable and pivotable with respect to the housing;

wherein the first end defines an opening for a securing implement to extend through to physically secure the housing.

2. A computer system having a system processor and comprising:

a housing which houses a peripheral device, the peripheral device being operably coupled to the system processor; and a securing device physically coupled to the housing, the securing device being slideable and pivotable with respect to the housing;

wherein the peripheral device includes a speaker.

3. A computer system having a system processor and comprising:

a housing which houses a peripheral device, the peripheral device being operably coupled to the system processor; and a securing device physically coupled to the housing, the securing device being slideable and pivotable with respect to the housing;

wherein the housing includes a housing for an audio hub.

4. The computer system of claim 1 further comprising:

a main system housing, the main system housing which houses the system processor;

whereby the housing is physically securable to the main system housing via the securing device.

5. A computer system having a system processor and comprising:

a housing which houses a peripheral device, the peripheral device being operably coupled to the system processor;

a securing device physically coupled to the housing, the securing device being slideable and pivotable with respect to the housing; and a main system housing, the main system housing which houses the system processor;

whereby the housing is physically securable to the main system housing via the securing device;

wherein the main system housing defines a first opening;

wherein the securing device defines a second opening;

whereby a securing implement extends through the first opening and the second opening to physically secure the main system housing to the housing.

6. The computer system of claim 5 wherein:

the securing device is pivotable and slideable with respect to the housing thereby to align the second opening with the first opening to allow the securing implement to extend through the first and second openings.

7. The computer system of claim 5 wherein the securing implement includes a padlock shackle.

8. The computer system of claim 5 wherein the securing implement includes a security cable.

9. The computer system of claim 5 wherein:

the second opening is movable with respect to the housing to align the second opening with the first opening, thereby to accommodate variations in the first opening location of various main system housing types.

10. The computer system of claim 1 wherein:

the securing device is physically coupled to the housing via a pin structure and slot accommodating the pin structure.

11. The computer system of claim 10 further wherein:

the pin structure is connected to the securing device;

the housing defines the slot.

12. A computer system having a system processor and comprising:

a housing which houses a peripheral device, the peripheral device being operably coupled to the system processor; and a securing device physically coupled to the housing, the securing device being slideable and pivotable with respect to the housing;

wherein the securing device is physically coupled to the housing via a pin structure and slot accommodating the pin structure;

wherein the pin structure is movable within the slot to enable the securing device to be slideable with respect to the housing.

13. A computer system having a system processor and comprising:

a housing which houses a peripheral device, the peripheral device being operably coupled to the system processor; and a securing device physically coupled to the housing the securing device being slideable and pivotable with respect to the housing;

wherein the securing device includes a rigid member having a first end and a second end;

wherein the first end defines an opening for a securing implement to extend through to physically secure the housing;

wherein the opening is elongated.

14. A computer system having a system processor and comprising:

a housing which houses a peripheral device, the peripheral device being operably coupled to the system processor; and a securing device physically coupled to the housing, the securing device being slideable and pivotable with respect to the housing;

wherein the securing device includes a member having a first end and a second end;

wherein the first end defines an opening for a securing implement to extend through to physically secure the housing;

wherein the first end has a dog leg form.

15. A computer system having a system processor and comprising:

a housing which houses a peripheral device, the peripheral device being operably coupled to the system processor; and a securing device physically coupled to the housing the securing device being slideable and pivotable with respect to the housing;

wherein the housing defines a securing device compartment, the housing having a wall, the wall defining an opening to the securing device compartment;

wherein in a retracted position, the securing device resides at least substantially within the compartment;

wherein in an extended position, the securing device extends out from the opening in the wall.

16. The computer system of claim 15 wherein:

the securing device is slideable between its retracted position and extended positions.

17. The computer system of claim 16 wherein:

in its retracted position, the securing device is at least substantially non-pivotal with respect to the housing;

in its extended position, the securing device is pivotal with respect to the housing.

18. The computer system of claim 15 wherein the compartment has a first cross section at the opening of the compartment and a second narrower cross section located towards the interior of the compartment.

19. The computer system of claim 15 wherein the housing defines a slot in a wall of the compartment, and a portion of the securing device extends through and is secured in the slot to physically couple the securing device to the housing.

20. The computer system of claim 19 wherein the portion of the securing device is movable within the slot to enable the securing device to be slideable with respect to the housing.

21. The computer system of claim 15 wherein when in a fully extended position, the securing device is pivotable by at least 70 degrees with respect to the housing.

22. An apparatus for securing computer equipment, the apparatus comprising:

a computer equipment housing; and a securing device physically coupled to the housing, the securing device being slideable and pivotable with respect to the housing;

wherein the securing device includes a rigid member having a first end and a second end;

wherein the rigid member is slideable and pivotable with respect to the housing;

wherein the first end defines an opening for a securing implement to extend through to physically secure the housing.

23. An apparatus for securing computer equipment, the apparatus comprising:

a computer equipment housing; and a securing device physically coupled to the housing, the securing device being slideable and pivotable with respect to the housing;

wherein the housing houses an audio hub.

24. An apparatus for securing computer equipment, the apparatus comprising:

a computer equipment housing; and a securing device physically coupled to the housing, the securing device being slideable and pivotable with respect to the housing;

wherein the housing houses a speaker.

25. The apparatus of claim 24 wherein:

the rigid member is physically coupled to the housing via a pin structure and slot accommodating the pin structure.

26. The apparatus of claim 25 further wherein:

the pin structure is connected to the securing device;

the housing defines the slot.

27. An apparatus for securing computer equipment, the apparatus comprising:

a computer equipment housing; and a securing device physically coupled to the housing, the securing device being slideable and pivotable with respect to the housing;

wherein the securing device is physically coupled to the housing via a pin structure and slot accommodating the pin structure;

wherein the pin structure is movable within the slot to enable the securing device to slide with respect to the housing.

28. The apparatus of claim 27 wherein the pin structure is secured in the slot with a fastener accessible from the interior of the housing.

29. The apparatus of claim 22 wherein the opening is elongated.

30. An apparatus for securing computer equipment, the apparatus comprising:

a computer equipment housing; and a securing device physically coupled to the housing, the securing device being slideable and pivotable with respect to the housing;

wherein the housing defines a securing device compartment, the housing having a wall, the wall defining an opening to the compartment;

wherein in its retracted position, the securing device resides at least substantially within the compartment;

wherein in its extended position, the securing device extends out from the opening in the wall.

31. The apparatus of claim 30 wherein the securing device is slideable between the retracted and extended positions.

32. The apparatus of claim 30 wherein:

in its retracted position, the securing device is at least substantially non-pivotal with respect to the housing;

in its extended position, the securing device is pivotal with respect to the housing.

33. The apparatus of claim 32 wherein the housing defines a slot in a wall of the compartment, a portion of the securing device extends through and is secured in the slot to physically couple the securing device to the housing.

34. The apparatus of claim 30 wherein the portion of the securing device is movable within the slot to enable the securing device to slide with respect to the housing.

35. The apparatus of claim 30 wherein when in a fully extended position, the securing device is pivotable by at least 70 degrees with respect to the housing.

36. A securing device for securing computer equipment comprising:

a bar like securing member having a first portion and a second portion, the first portion having a structure which engages a securing implement, an attachment mechanism connected to the second portion, the attachment mechanism physically couples the bar like securing member to a computer equipment housing, the bar like securing member being pivotable and slideable with respect to the housing wherein the bar like securing member is rigid.

37. The securing device of claim 36 wherein the structure which engages includes an opening defined by the first portion for receiving the securing implement.

38. The securing device of claim 36 wherein the attachment mechanism includes a pin structure, the pin structure is secured in a defined opening in a computer equipment housing to physically couple the securing member to the housing.

39. A securing device for securing computer equipment comprising:

a securing member having a first portion and a second portion the first portion having a structure which engages a securing implement, an attachment mechanism connected to the second portion, the attachment mechanism physically couples the securing member to a computer equipment housing, the securing member being pivotable and slideable with respect to the housing;

wherein the first portion has a dog leg form;

wherein the structure for engaging includes an elongated opening defined by the dog leg form.

40. The securing device of claim 36 wherein the securing member is of metal.

41. The securing device of claim 36 wherein the second portion of the securing member defines a slot, the attachment mechanism being secured within the slot.

* * * * *